(12) United States Patent
Chen

(10) Patent No.: US 8,030,165 B2
(45) Date of Patent: Oct. 4, 2011

(54) POLY GATE ETCH METHOD AND DEVICE FOR SONOS-BASED FLASH MEMORY

(75) Inventor: John Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 156 days.

(21) Appl. No.: 12/259,053

(22) Filed: Oct. 27, 2008

(65) Prior Publication Data

US 2009/0291550 A1 Nov. 26, 2009

(30) Foreign Application Priority Data

May 23, 2008 (CN) .......................... 2008 1 0038057

(51) Int. Cl.
*H01L 29/792* (2006.01)
(52) U.S. Cl. ................... 438/288; 257/E21.21
(58) Field of Classification Search .................. 438/288, 438/585, 595; 257/E21.21
See application file for complete search history.

(56) References Cited

U.S. PATENT DOCUMENTS

| | | | |
|---|---|---|---|
| 6,207,502 B1 * | 3/2001 | Au et al. ...................... | 438/258 |
| 6,566,196 B1 * | 5/2003 | Haselden et al. ............. | 438/257 |
| 7,148,107 B1 * | 12/2006 | Pittikoun ...................... | 438/258 |
| 7,732,856 B2 * | 6/2010 | Sim et al. ...................... | 257/324 |
| 2002/0132430 A1 * | 9/2002 | Willer et al. .................. | 438/262 |
| 2004/0056319 A1 * | 3/2004 | Kuo et al. ...................... | 257/406 |
| 2004/0266206 A1 * | 12/2004 | Cleeves ........................ | 438/719 |
| 2005/0093047 A1 * | 5/2005 | Goda et al. ................... | 257/300 |
| 2005/0265093 A1 * | 12/2005 | Hashimoto et al. ........... | 365/202 |
| 2008/0157164 A1 * | 7/2008 | Hong ............................ | 257/316 |

* cited by examiner

*Primary Examiner* — Matthew Smith
*Assistant Examiner* — Michele Fan
(74) *Attorney, Agent, or Firm* — Kilpatrick Townsend & Stockton LLP

(57) ABSTRACT

A method for forming flash memory devices is provided. The method includes providing a semiconductor substrate, which comprises a silicon material and has a periphery region and a cell region. The method further includes forming an isolation structure between the cell region and the periphery region. Additionally, the method includes forming an ONO layer overlying the cell region and the periphery region. Furthermore, the method includes removing the ONO layer overlying the periphery region to expose silicon material in the periphery region. The method also includes forming a gate dielectric layer overlying the periphery region, while protecting the ONO layer in the cell region. In addition, the method includes forming a polysilicon layer overlying the cell region and the periphery region.

11 Claims, 8 Drawing Sheets

POLY GATE ETCH METHOD AND DEVICE FOR SONOS-BASED FLASH MEMORY

CROSS-REFERENCE TO RELATED APPLICATIONS

This application claims priority to Chinese Patent Application No. 200810038057.5, filed May 23, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method of semiconductor device formation with a simplified process flow. Merely by way of example, the invention has been applied to the formation of SONOS-based non-volatile memory or flash technologies, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to remove a layer and form structures without damaging the active device.

As merely an example, etching processes are often used to remove or partially remove a layer to form structures therefrom. Etching is often performed by an etching tool, such as a dry etcher or wet etcher. The wet etcher often includes a vessel that has an etchant chemical to selectively remove one material from another material. The dry etcher often includes a plasma source and treatment chamber. The dry etcher often uses gases such as fluorine bearing species and chlorine bearing species to remove semiconductor materials such as silicon or metal such as aluminum. For example, dry and wet etchers may be used within the formation of SONOS-based non-volatile memory or flash memories. A conventional polysilicon gate etch process consists of a two-step etch process used to etch the polysilicon and ONO layers. The first step etches away polysilicon and stops at the top oxide layer of the ONO layer within both the cell and periphery regions. A second etch step etches the top oxide and silicon nitride of the ONO layer away and stops at the remaining oxide. The two-step poly gate etch process is used to ensure that both the periphery and cell devices can obtain the best gate etch profile without degrading device performance. However, a simplified poly gate etch process could be used, thus simplifying the process flow and providing improved process efficiency.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method of semiconductor device formation with a simplified process flow. Merely by way of example, the invention has been applied to the formation of SONOS-based non-volatile memory or flash technologies, but it would be recognized that the invention has a much broader range of applicability.

In a specific embodiment of the present invention, a method for forming flash memory devices is provided. The method includes providing a semiconductor substrate, which comprises a silicon material and has a periphery region and a cell region. The method further includes forming an isolation structure between the cell region and the periphery region. Additionally, the method includes forming an ONO layer overlying the cell region and the periphery region. Furthermore, the method includes removing the ONO layer overlying the periphery region to expose silicon material in the periphery region. The method also includes forming a gate dielectric layer overlying the periphery region, while protecting the ONO layer in the cell region. In addition, the method includes forming a polysilicon layer overlying the cell region and the periphery region. The method also includes patterning the polysilicon layer to form a first gate structure in the cell region while stopping on at least a top oxide layer of the ONO layer and forming a second gate structure in the periphery region, while stopping on the gate oxide in the periphery layer. Additionally, the method includes preserving a transistor characteristic of an MOS transistor associated with the first gate structure using at least the top oxide layer of the ONO layer during the patterning of the polysilicon layer. The method also includes forming first spacer structures on the first gate structure and forming second spacer structures on the second gate structure, while removing any exposed portion of the ONO layer to expose the silicon material in the cell region. Furthermore, the method includes forming silicide material overlying a first source and a first drain associated with the first gate structure and a second source and a second drain associated with the second gate structure.

Many benefits are achieved by way of the present invention over conventional techniques. For example, the present technique provides an easy to use process that relies upon conventional technology. In some embodiments, a simplified process flow for the formation of flash memory devices is provided. A single-step poly gate etch process can be used which etches both the periphery and gate regions with no detriment to device performance. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method of semiconductor device formation with a simplified process flow. Merely by way of example, the invention has been applied to the formation of SONOS-based non-volatile memory or flash technologies, but it would be recognized that the invention has a much broader range of applicability.

Figure 1:
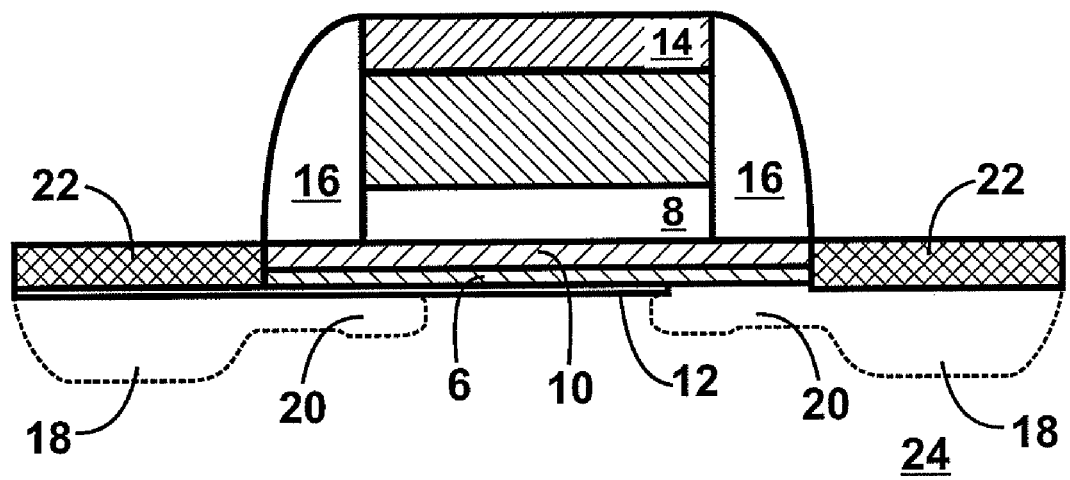
FIG. 1 is a conventional cross-section of a cell region for a SONOS-based flash memory device.

FIG. 1 is a conventional cross-section of a cell region for a SONOS-based flash memory device. Cell device 2 is formed on a semiconductor substrate 4, which may be made from a silicon material. An oxide-nitride-oxide (ONO) layer 6 overlies a portion of the semiconductor substrate. The ONO layer 6 comprises an upper oxide layer 8, an intermediary nitride layer 10, and a lower oxide layer 12. The nonconducting oxide layers 8 and 12 function as an electrical charge trapping medium. A gate 18 typically made from polysilicon overlies the upper oxide layer 8. Programming of the cell device 2 may be performed by storing hot electrons within the intermediary nitride layer 10. Spacers 16 are formed on the sidewalls of the control gate and top oxide layer 8 and may be formed from silicon oxide or an ONO layer. A salicide region 14 overlies the polysilicon gate 19 to form a polycide control gate for the cell device 2. Additional salicide regions 22 provide contacts to the underlying source and drain regions 18. Lightly-doped drain and source (LDD) regions 20 are adjacent to source/drain regions 18 and are present underneath a portion of ONO layer 6. The LDD regions 20 may comprise a low concentration impurity region in comparison with the higher concentrations seen within the source and drain regions 10.

Figure 2:
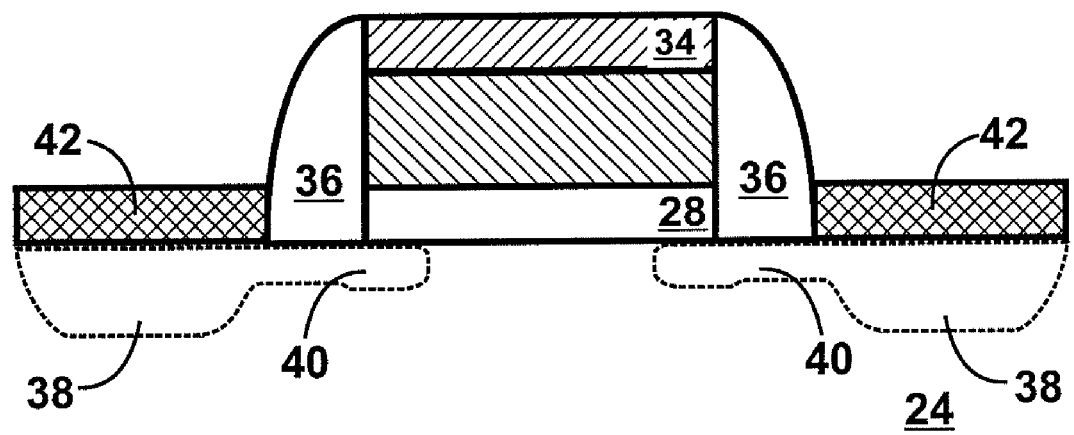
FIG. 2 is a conventional cross-section of a periphery region for a SONOS-based flash memory device.
Figure 3:
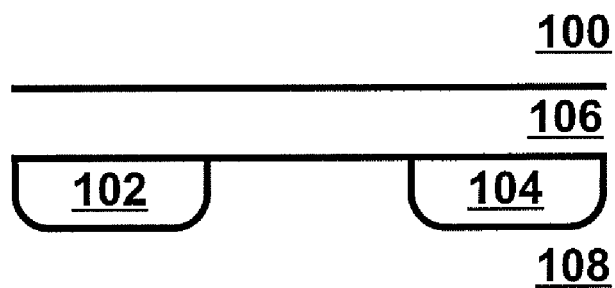
FIGS. 3-9 are simplified exemplary cross-sections of a cell region for a SONOS-based flash memory device according to an embodiment of the present invention.
Figure 4:
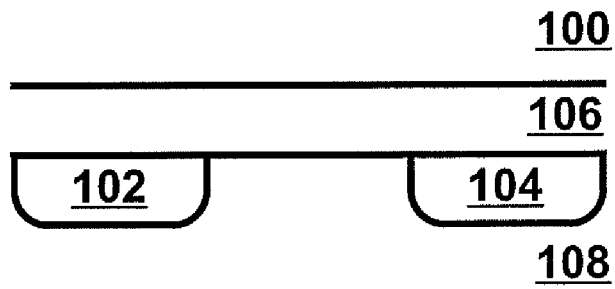
Figure 5:
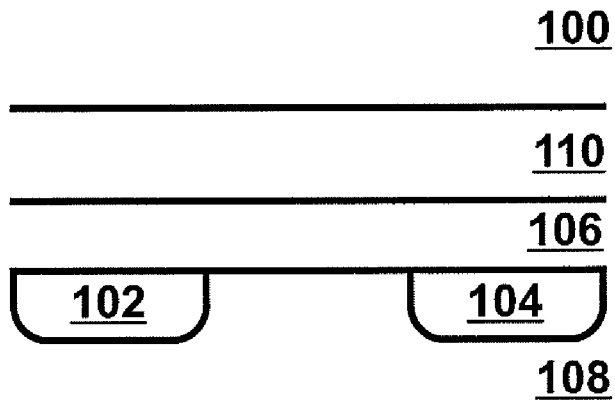
Figure 6:
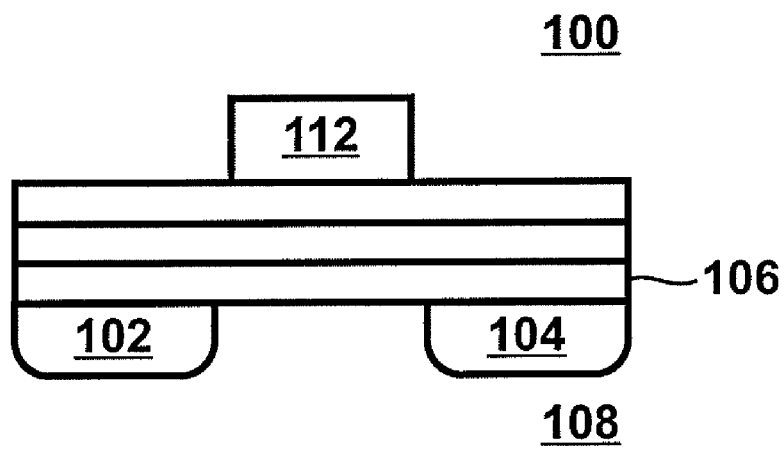
Figure 7:
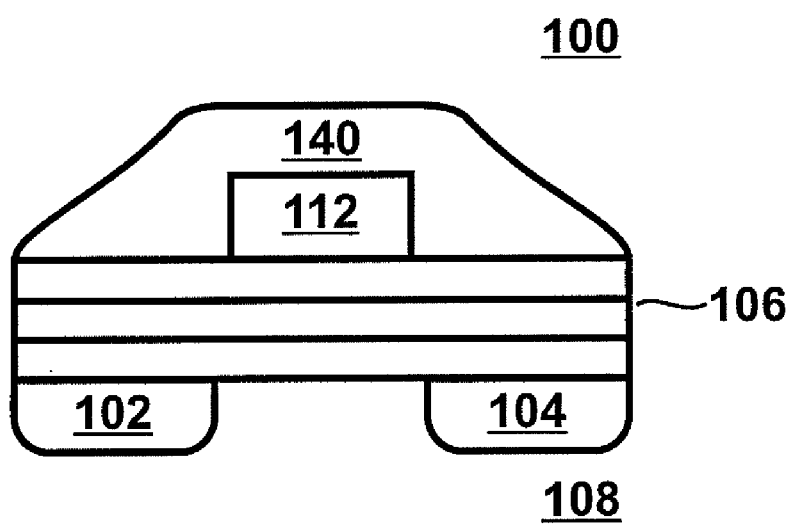
Figure 8:
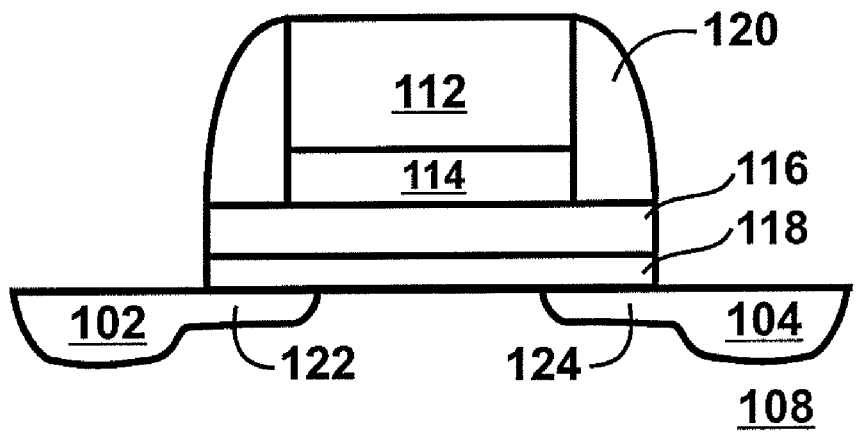
Figure 9:
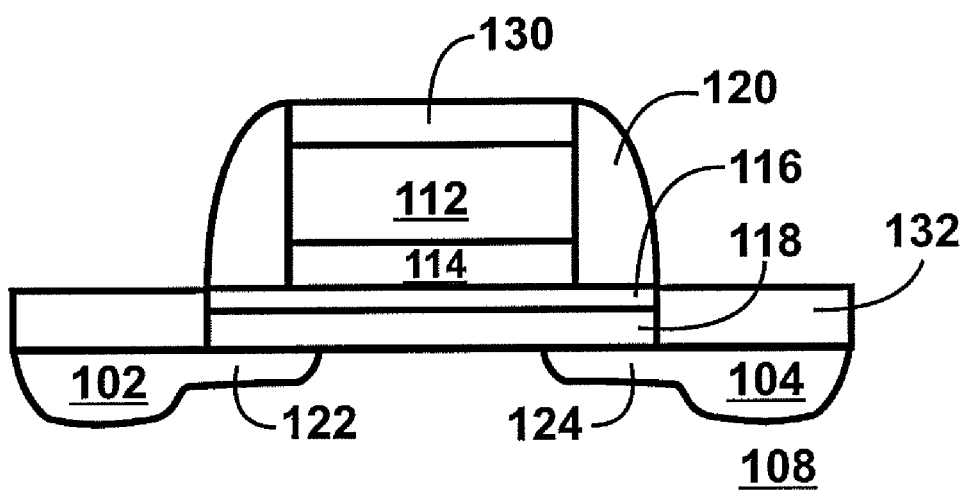
Figure 10:
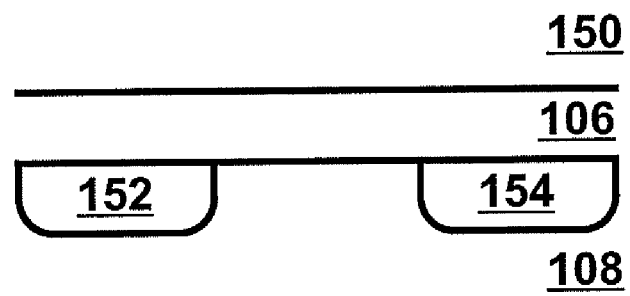
FIGS. 10-16 are simplified exemplary cross-sections of a periphery region for a SONOS-based flash memory device according to an embodiment of the present invention.
Figure 11:
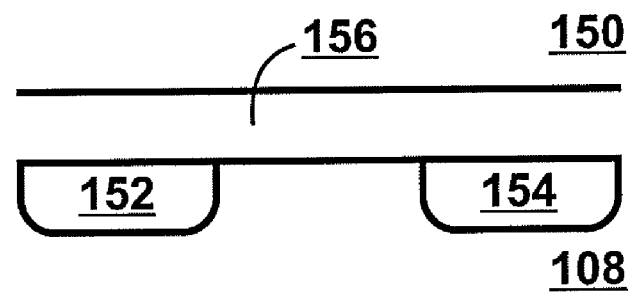
Figure 12:
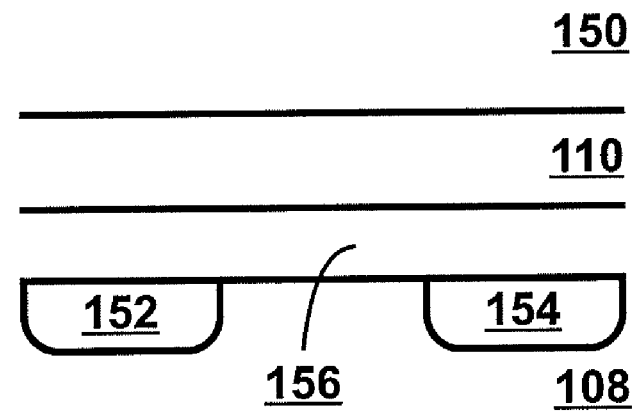
Figure 13:
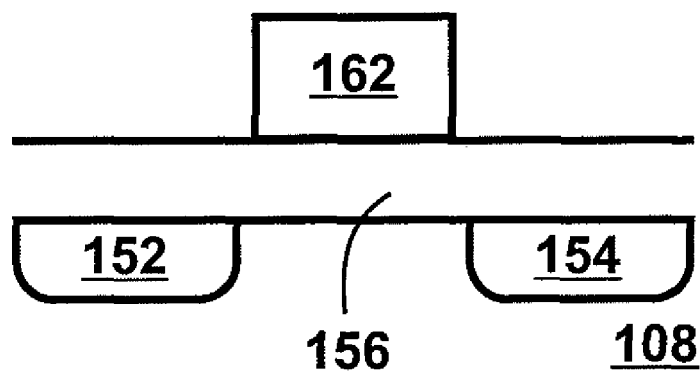
Figure 14:
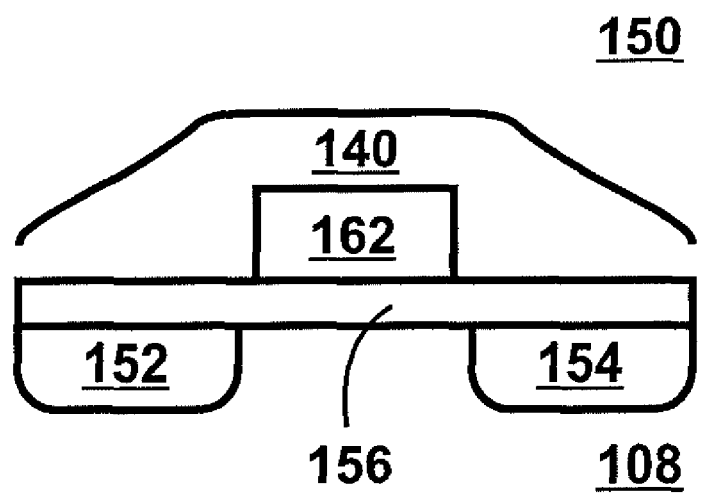
Figure 15:
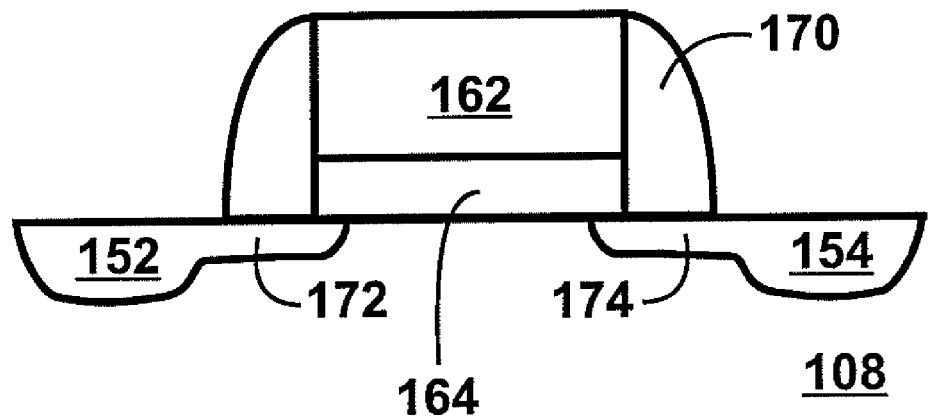
Figure 16:
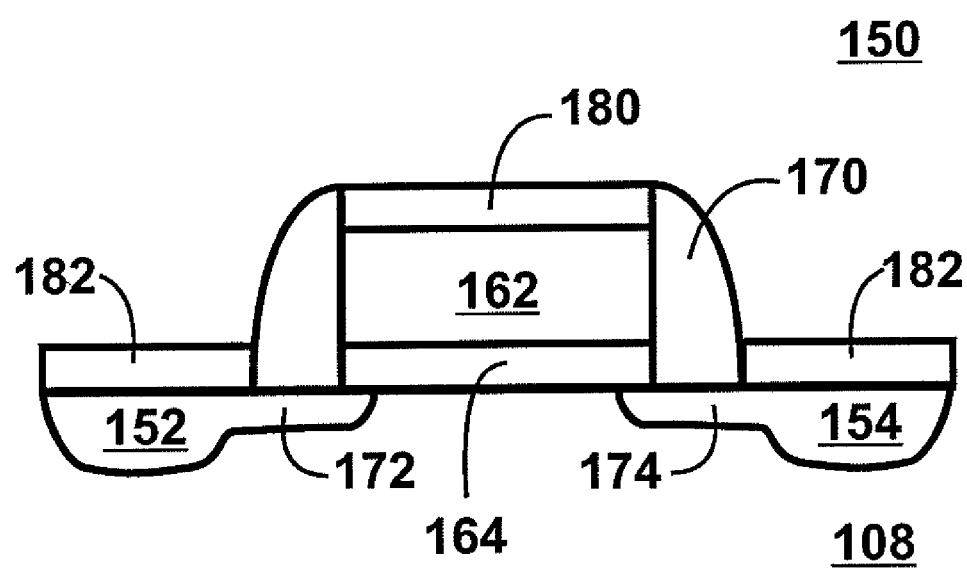

FIG. 2 is a conventional cross-section of a periphery region for a SONOS-based flash memory device that may be viewed in conjunction with FIG. 1. For example, FIG. 2 is a cross-section of a periphery device that may be formed using the same semiconductor processes used to form the cross-section shown within FIG. 1. One or more additional cell devices (not shown) and shallow trench isolation regions (not shown) may separate the cell device 2 from the periphery device 22.

Similar to FIG. 1, the periphery device 22 is formed on a semiconductor substrate 4, which may be made from a silicon material. A polysilicon gate 38 overlies a gate oxide layer 28. A salicide region 34 overlies the polysilicon gate 38 to form a polycide control gate for the periphery device 22. Spacer regions 36 are formed adjacent to the polysilicon gate 38, the gate oxide layer 28, and the salicide region 34 to provide improved electrical isolation. Additional salicide regions 42 are formed adjacent to the gate area on the surface of the semiconductor substrate 24 to contact source and drain regions 38, which are adjacent to LDD regions 40.

In a conventional process flow, a two-step etch process is used to form polysilicon regions 18, 38 on the cell device 2 and the periphery device 22. A polysilicon layer is first deposited overlying the ONO layer in the cell region and overlying the oxide layer 28 in the periphery region. A photolithography and masking process is used to deposit and pattern layers of photoresist in the appropriate areas to prepare the substrate for etching. The first etch process etches away portions of the polysilicon layer and stops at the oxide layer for both the cell device 2 and the periphery device 22. For the cell device, the oxide layer is the top layer of the ONO device, and for the periphery device, the oxide layer is the gate oxide layer. The second etch process removes the top oxide 8 and the silicon nitride layer 10 within the cell device 2 and stops at the bottom oxide etch, to prevent the silicon substrate from being etched away. As a result, the polysilicon layer is patterned to form polysilicon regions 18, 38 on the cell device 2 and the periphery device 22. This two-step etch process is used to ensure that both the periphery device 22 and cell device obtain the best polysilicon gate etch profile without degrading device performance. This is especially important for logic technology with embedded non-volatile memory solutions as it is often necessary for non-volatile cell and periphery devices to be performing at optimum levels.

One potential approach to optimize the existing processes used in SONOS-based flash memory could be to simplify the two-step etch process currently used to a single-step poly gate etch process. For example, a single-step etch process could be used to form a cell and periphery device that is still able to program, erase, and read the electrons stored in an insulating SiN storage medium sandwiched between the two oxide layers. The process flow required to form the device can also be simplified, especially for logic-compatible embedded processes. Additional cost and time savings may also be realized, allowing the semiconductor device to be produced in a more cost-effective and efficient manner. The profile of the polysilicon gate is also maintained to ensure both cell and periphery devices can function at optimized process conditions.

FIGS. 3-9 are simplified exemplary cross-sections of a cell region for a SONOS-based flash memory device according to an embodiment of the present invention, and FIGS. 10-16 are simplified exemplary cross-sections of a periphery region for a SONOS-based flash memory device according to an embodiment of the present invention. These diagrams are merely examples, which should not unduly limit the scope of the claims. One of ordinary skill in the art would recognize many variations, alternatives, and modifications. For example, FIGS. 3-9 may be viewed in conjunction with FIGS. 10-16 as showing cross-sections of a cell region and a periphery region on the same semiconductor substrate.

Figure 17:
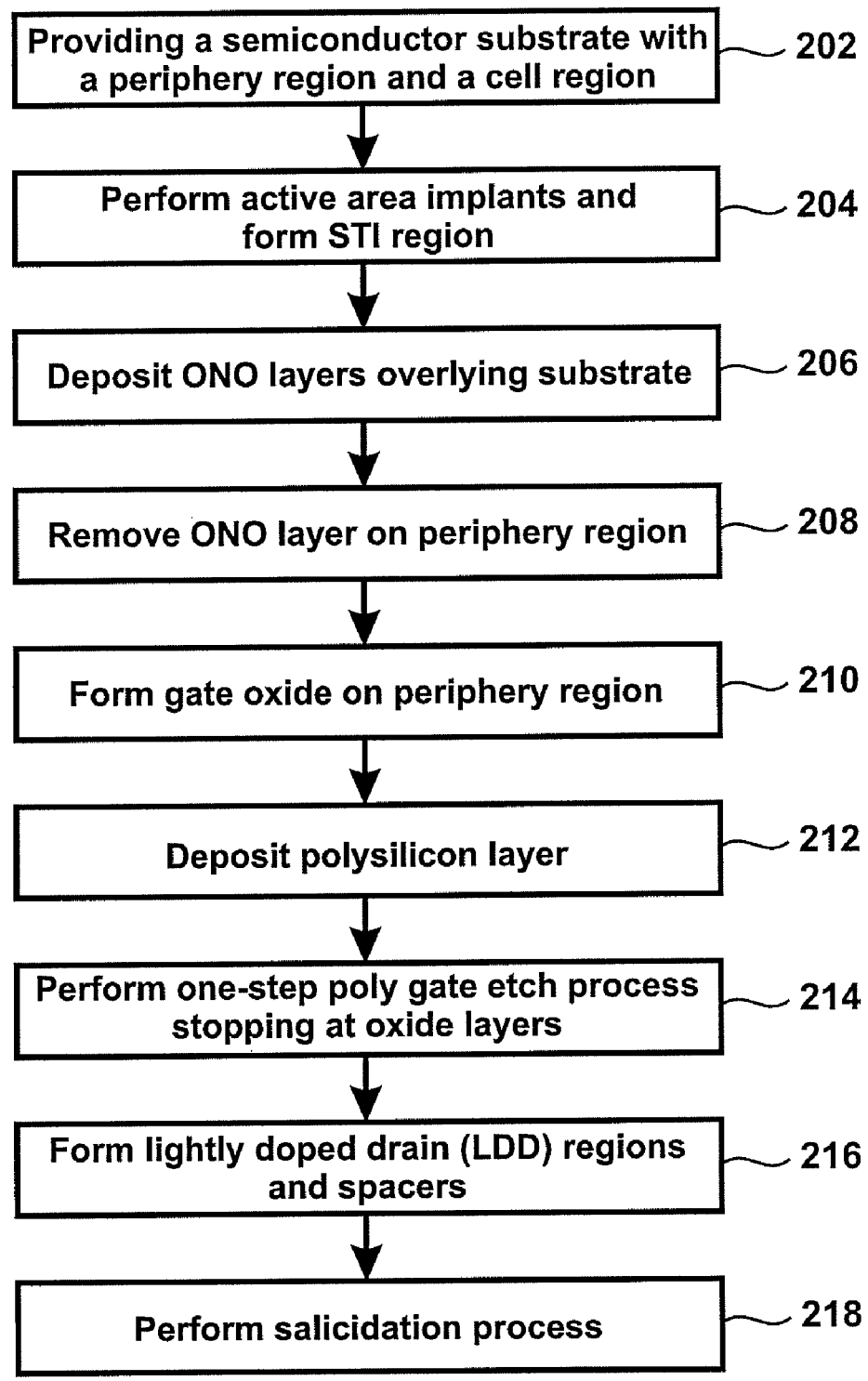
FIG. 17 is a simplified process flow diagram showing processes used in the formation of a SONOS-based flash memory device according to an embodiment of the present invention.

FIG. 17 is a simplified process flow diagram showing processes used in the formation of a SONOS-based flash memory device according to an embodiment of the present invention. For example, process flow 200 includes process 202 for providing a semiconductor substrate with a periphery region and a cell region, process 204 for performing active area implants and forming an STI region, process 206 for depositing an ONO layer overlying the substrate, process 208 for removing the ONO layer on the periphery region, process 210 for forming a gate oxide on the periphery region, process 212 for depositing a polysilicon layer, process 214 for performing a one-step polysilicon gate etch process stopping at the oxide layers, process 216 for forming lightly doped source/drain regions and spacers, and process 218 for performing a salicidation process. This diagram is merely an example, which should not unduly limit the scope of the claims. One of ordinary skill in the art would recognize many variations, alternatives, and modifications. Depending upon the application, certain steps may be combined or even separated. Certain steps may be performed in other order or sequence also depending upon the embodiment. Other steps may be added or steps may be omitted depending upon the embodiment. These and other details are found throughout the present specification and more particularly below. For example, FIG. 17 may be viewed in conjunction with FIGS. 3-16.

In process 102, a semiconductor substrate 108 is provided that has a periphery region 150 and a cell region 100. For example, the cell region 100 may be one of a plurality of cell regions formed on the semiconductor substrate 108. A number of cell regions may separate the cell region 100 shown within FIGS. 3-9 from the periphery region 150 shown in FIGS. 10-16. In process 104, active area implants are performed to form source regions 102, 152 and drain regions 104, 154 and an isolation structure such as an STI region (not shown) is formed between the cell region 100 and the periphery region 150. Multiple STI regions may also be formed between the cell region 100 shown in FIG. 3 and the periphery region 150 shown in FIG. 10, if multiple cell regions are present on the semiconductor substrate 108. In process 106, an ONO layer 106 is deposited on the substrate 108 over both the cell region 100 and periphery region 150. The ONO layer 106 may comprise a bottom oxide layer situated on the semiconductor substrate 108, a nitride layer situated over the bottom oxide layer, and a top oxide layer situated over the nitride layer. In a specific embodiment, the thickness of the bottom oxide is 100 Å, the thickness of the nitride layer is 60 Å, and the thickness of the top oxide is 40 Å. The use of the ONO layer 106 may provide an increased process margin for subsequent patterning processes. Of course, there can be other variations, modifications, and alternatives. The result of these processes can be seen in FIG. 3 for the cell region and FIG. 10 for the periphery region.

The ONO layer 106 in the periphery region 150 is removed in process 208. For example, a controlled etch or series of etch processes may be performed to remove the ONO layer 106 in the periphery region 150 without damaging the semiconductor substrate 108. Alternatively, a wet strip process may also be used where a sulfuric acid bearing species is used as the stripping agent. As a result of the removal of ONO layer 106 in the periphery region 150, the semiconductor substrate 108 is exposed. A gate oxide 156 is then grown in the periphery region overlying the semiconductor substrate 108 in process 210. For example, the thickness of the gate oxide may be less than about 70 Å. A gate oxide is not grown in the cell region. Of course, there can be other variations, modifications, and alternatives. The result of these processes can be seen in FIGS. 4 and 11.

A polysilicon layer 110 is deposited in the cell region 100 and the periphery region 150 in process 212. The polysilicon layer 110 overlies the ONO layer 106 in the cell region 100 and overlies the gate oxide layer in the periphery region 150. The result of process 212 can be seen in FIGS. 5 and 12. In process 214, a one-step poly gate etch process is performed which etches the polysilicon layer 110 in both the cell region 100 and the periphery region 150. The etch stops at the top oxide layer of the ONO layer 106 in the cell region 100 and at the gate oxide layer 156 on the periphery region 150. As a result, polysilicon gates 112 and 162 are formed. For example, a transistor characteristic of a MOS transistor associated with the gate structure being formed within the cell region may be preserved by using at least the top oxide layer of the ONO layer during the patterning process. Similarly, the patterning process may also preserve a transistor characteristic of the second gate structure. Of course, there can be other variations, modifications, and alternatives. The result of these processes can be seen in FIGS. 6 and 13.

In process 216, lightly-doped drain (LDD) regions 122, 124, 172, 174 are formed in addition to spacers 120, 170. For example, a spacer layer 140 may be deposited overlying the cell region 100 and the periphery region 150. For example, the spacer layer 140 may comprise an ONO structure. The spacer layer 140 overlies the polysilicon gate 112 and the ONO layer 106 in the cell region 100 and overlies the polysilicon gate 162 and the ONO layer 106 in the periphery region 150. The result of this process can be seen in FIGS. 7 and 14. The LDD regions are then patterned to form a first set of spacer structures 120 in the cell region 100 and a second set of spacer structures 170 in the periphery region 150. For example, an isotropic etch process may be employed to pattern the spacer layer 140 into the first and second set of spacer structures 120, 170. In addition, the process of patterning the spacer layer 122 can also be used to pattern the ONO layer 106 in the cell region 100. For example portions of the ONO layer 106 adjacent to the gate structure may be removed. Correspondingly, the spacer etch process can also be used to pattern gate oxide layer 156 within the periphery region 150. For example, the spacer etch process may be used to remove portions of the ONO layer 106 adjacent to the gate structure, and portions of gate oxide layer 156 in the periphery region 150. In one example, portions of the ONO layer 106 in the gate structure in the cell region 100 are not removed. In another example, at least a portion of the gate oxide on the surface of substrate 108 in the periphery may be maintained to protect substrate 108 from damage. The ONO layer 106 additionally comprises top oxide layer 114, nitride layer 116, and bottom oxide layer 118, and the gate oxide layer 156 is patterned to form gate oxide region 164. Of course, there can be other variations, modifications, and alternatives.

Following the formation of spacer regions 120 and 170, LDD regions 122, 124, 172, 174 may be formed using the gate structure as a mask. In an alternative embodiment of the invention, the active area implantation in process 204 may be omitted and both LDD and active area regions can be formed within process 216. An additional diffusion process may also be used to obtain the desired concentration profile for the LDD regions 122, 124, 172, and 174 and the source/drain regions 102, 104, 152, 154. Of course, there can be other variations, modifications, and alternatives. The result of these processes can be seen in FIGS. 8 and 15.

In process 218, a salicidation process is performed to form salicide regions 130, 132 within the cell region 100 and salicide regions 180, and 182 within the periphery region 150. The salicide region 130 is formed overlying the polysilicon gate 112 to form a polycide control gate for the cell device 100. The additional salicide regions 132 provide contacts to the underlying source and drain regions 102 and 104. Similarly, salicide region 180 may be used to form a polycide control gate for the periphery device 150, with the salicide regions 182 providing contacts to the underlying source and drain regions 152 and 154. For example, the salicide regions may be formed by depositing a transition metal layer selected from a group consisting of Co (cobalt), Ti (titanium), Ni (nickel) and the like over the cell devices, patterning the transition metal layer, and annealing the self-aligned silicide layer. Of course, there can be other variations, modifications, and alternatives. The result of these processes can be seen in FIGS. 9 and 16.

The gate structure within the cell region may be characterized by a 0.8 micron design rule or less. In addition, the flash memory device formed using embodiments of the present invention may be located within an embedded device.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming flash memory devices, the method comprising:
   providing a semiconductor substrate, the semiconductor substrate comprising a silicon material and having a periphery region and a cell region;
   forming an isolation structure between the cell region and the periphery region;
   forming an ONO layer overlying the cell region and the periphery region, the ONO layer comprising a bottom oxide layer, a nitride layer, and a top oxide layer;
   removing the ONO layer overlying the periphery region to expose silicon material in the periphery region;
   forming a gate dielectric layer overlying the periphery region, while protecting the ONO layer in the cell region;
   forming a polysilicon layer overlying the cell region and the periphery region;
   patterning the polysilicon layer to form a first gate structure in the cell region, while stopping on at least the top oxide layer of the ONO layer and to form a second gate structure in the periphery region, while stopping on the gate dielectric in the periphery region;
   forming first dielectric spacer structures on the first gate structure with an etch process that stops at the nitride layer of the ONO layer and forming second dielectric spacer structures on the second gate structure;
   removing remaining portions of the ONO layer unmasked by the first dielectric spacer structures to expose the silicon material in the cell region and removing exposed portion of the gate dielectric to expose the silicon material in the periphery region,
   wherein forming the first and second dielectric spacer structures also exposes top surfaces of the first and the second gate structures, respectfully; and
   forming salicide material overlying the first gate structure and a first source and a first drain associated with the first gate structure, the salicide material also overlying the second gate structure and a second source and a second drain associated with the second gate structure.

2. The method of claim 1 wherein the gate dielectric layer is less than about 70 Angstroms.

3. The method of claim 1 wherein the ONO layer includes a bottom oxide of 100 Angstroms, a nitride layer of 60 Angstroms, and a top oxide of 40 Angstroms.

4. The method of claim 1 wherein the first gate structure is characterized by a 0.8 micron design rule and less.

5. The method of claim 1 wherein the flash memory device is an embedded device.

6. The method of claim 1 wherein the removing the ONO layer uses a wet stripping process, the wet stripping process using a sulfuric acid bearing species.

7. The method of claim 1 wherein the first spacer structures and the second spacer structures comprise an ONO layer structure.

8. The method of claim 1 wherein the first gate structure is associated a SONOS (silicon oxide nitride silicon) flash device.

9. The method of claim 1 wherein the first gate structure is a control gate.

10. The method of claim 1 wherein the ONO layer comprises an intermediary nitride layer, the intermediary nitride layer being capable of storing a plurality of electrons to store a state condition.

11. The method of claim 1 wherein the isolation structure is an STI structure.

* * * * *